United States Patent
Venkatasubramanian et al.

(10) Patent No.: US 11,158,507 B2
(45) Date of Patent: Oct. 26, 2021

(54) IN-SITU HIGH POWER IMPLANT TO RELIEVE STRESS OF A THIN FILM

(71) Applicant: Applied Materials, Inc., Santa Clara, CA (US)

(72) Inventors: Eswaranand Venkatasubramanian, Santa Clara, CA (US); Pramit Manna, Santa Clara, CA (US); Abhijit B. Mallick, Fremont, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 34 days.

(21) Appl. No.: 16/430,136

(22) Filed: Jun. 3, 2019

(65) Prior Publication Data
US 2019/0393034 A1   Dec. 26, 2019

Related U.S. Application Data

(60) Provisional application No. 62/688,721, filed on Jun. 22, 2018.

(51) Int. Cl.
*H01L 21/033* (2006.01)
*H01J 37/317* (2006.01)
(Continued)

(52) U.S. Cl.
CPC ...... *H01L 21/0334* (2013.01); *H01J 37/3171* (2013.01); *H01L 21/02115* (2013.01);
(Continued)

(58) Field of Classification Search
CPC ............ H01L 21/0334; H01L 21/3105; H01L 21/31144; H01L 21/67253;
(Continued)

(56) References Cited

U.S. PATENT DOCUMENTS 8,361,906 B2   1/2013   Lee et al.
9,412,613 B2   8/2016   Manna et al.
(Continued)

FOREIGN PATENT DOCUMENTS

JP         08102532 A    4/1996
KR    20120121340 A   11/2012
(Continued)

OTHER PUBLICATIONS

PCT International Search Report and Written Opinion dated Sep. 23, 2019, for International Application No. PCT/US2019/035497.

*Primary Examiner* — Shahed Ahmed
(74) *Attorney, Agent, or Firm* — Patterson + Sheridan LLP

(57) ABSTRACT

Embodiments of the present disclosure generally relate to techniques for deposition of high-density films for patterning applications. In one embodiment, a method of processing a substrate is provided. The method includes depositing a carbon hardmask over a film stack formed on a substrate, wherein the substrate is positioned on an electrostatic chuck disposed in a process chamber, implanting ions into the carbon hardmask, wherein depositing the carbon hardmask and implanting ions into the carbon hardmask are performed in the same process chamber, and repeating depositing the carbon hardmask and implanting ions into the carbon hardmask in a cyclic fashion until a pre-determined thickness of the carbon hardmask is reached.

19 Claims, 9 Drawing Sheets

(51) Int. Cl.
*H01L 21/311* (2006.01)
*H01L 21/67* (2006.01)
*H01L 21/02* (2006.01)
*H01L 21/3105* (2006.01)

(52) U.S. Cl.
CPC ........ *H01L 21/033* (2013.01); *H01L 21/0332* (2013.01); *H01L 21/3105* (2013.01); *H01L 21/31144* (2013.01); *H01L 21/67253* (2013.01)

(58) Field of Classification Search
CPC ........... H01L 21/02115; H01L 21/0332; H01L 21/0234; H01L 21/02321; H01L 21/02274; H01L 21/67103; H01L 21/67109; H01L 21/6831; H01L 21/033–0338; H01L 21/027–0338; H01J 37/3171; H01J 37/32146
See application file for complete search history.

(56) References Cited

U.S. PATENT DOCUMENTS

| | | |
|---|---|---|
| 9,695,503 B2 | 7/2017 | Stowell et al. |
| 10,249,495 B2 | 4/2019 | Yang et al. |
| 2002/0144657 A1* | 10/2002 | Chiang ............. H01J 37/32449 118/723 E |
| 2009/0212010 A1 | 8/2009 | Wang et al. |
| 2011/0287633 A1 | 11/2011 | Lee et al. |
| 2011/0291243 A1* | 12/2011 | Seamons ........... H01L 21/02115 257/618 |
| 2013/0302996 A1 | 11/2013 | Reilly et al. |
| 2014/0170853 A1 | 6/2014 | Shamma et al. |
| 2014/0273461 A1 | 9/2014 | Lee et al. |
| 2015/0194317 A1* | 7/2015 | Manna ................ H01L 21/3086 438/694 |
| 2015/0371851 A1 | 12/2015 | Lee et al. |
| 2017/0103893 A1 | 4/2017 | Kulshreshtha et al. |
| 2018/0274089 A1 | 9/2018 | Yang et al. |
| 2018/0274100 A1 | 9/2018 | Yang et al. |
| 2019/0189444 A1* | 6/2019 | Sun ................... H01L 21/31116 |
| 2020/0066629 A1* | 2/2020 | Schenker .......... H01L 21/76808 |

FOREIGN PATENT DOCUMENTS

| | | |
|---|---|---|
| TW | 468209 B | 12/2001 |
| WO | 2015105651 A1 | 7/2015 |

* cited by examiner

IN-SITU HIGH POWER IMPLANT TO RELIEVE STRESS OF A THIN FILM

CROSS-REFERENCE TO RELATED APPLICATIONS

This application claims priority to U.S. Provisional Application Ser. No. 62/688,721 filed on Jun. 22, 2018, which is herein incorporated by reference in its entirety.

BACKGROUND

Field

Embodiments of the present disclosure generally relate to the fabrication of integrated circuits. More particularly, the embodiments described herein provide techniques for deposition of high-density films for patterning applications.

Description of the Related Art

Hardmasks are used to fabricate NAND and dynamic random access memory (DRAM) devices. Hardmasks are commonly used as sacrificial layers in lithographic patterning and enable, through an etch process, the patterning of features onto one or more of the material layers of a semiconductor device. The patterned features can form, for example, the transistors and interconnects that allow the NAND and DRAM devices to operate.

Some important properties of a hardmask material are etch resistance and compressive stress, for example. An ideal hardmask has a high etch resistance to an etchant used in the etch process as compared to the layer to be etched (hereinafter, an "underlayer"). Therefore, the underlayer can be etched at a rate much faster than the hardmask. An ideal hardmask also has a low compressive stress. Lower compressive stress eliminates undesirable substrate bow after hardmask deposition, which can make further device fabrication difficult.

In an effort to improve etch selectivity of the hardmask, high density carbon films and doped carbon films have been developed. One of the challenges with these new films is that high density carbon films exhibit high compressive stress, which results in undesirable substrate bow.

Therefore, there is a need in the art for improved methods of forming a hardmask which exhibits increased etch selectivity while maintaining or reducing the compressive stress of the hardmask material.

SUMMARY

Embodiments of the present disclosure generally relate to techniques for deposition of high-density films for patterning applications. In one embodiment, a method of processing a substrate is provided. The method includes depositing a carbon hardmask over a film stack formed on a substrate, wherein the substrate is positioned on an electrostatic chuck disposed in a process chamber, implanting ions into the carbon hardmask, wherein depositing the carbon hardmask and implanting ions into the carbon hardmask are performed in the same process chamber, and repeating depositing the carbon hardmask and implanting ions into the carbon hardmask in a cyclic fashion until a pre-determined thickness of the carbon hardmask is reached.

In another embodiment, a method of processing a substrate is provided. The method includes depositing a carbon hardmask over a substrate, wherein the carbon hardmask is deposited by applying a RF bias to an electrostatic chuck upon which the substrate is positioned to generate a plasma, and while depositing the carbon hardmask over the substrate, implanting ions from the plasma into the carbon hardmask using the RF bias, wherein depositing the carbon hardmask and implanting ions into the carbon hardmask are simultaneously performed in the same process chamber.

In yet another embodiment, a method of processing a substrate is provided. The method includes depositing a diamond-like carbon hardmask over a film stack formed on a substrate by applying a first RF power having a first power level to an electrostatic chuck via a first electrode, wherein the substrate is positioned on the electrostatic chuck in which the first electrode is disposed, implanting ions into the diamond-like carbon hardmask, wherein depositing the diamond-like carbon hardmask and implanting ions into the diamond-like carbon hardmask are performed in the same process chamber, repeating depositing the diamond-like carbon hardmask and implanting ions into the diamond-like carbon hardmask in a cyclic fashion until a pre-determined thickness of the diamond-like carbon hardmask is reached, patterning the diamond-like carbon hardmask, etching the film stack using the patterned diamond-like carbon hardmask, and removing the diamond-like carbon hardmask.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein include improved methods of fabricating carbon films with high-density (e.g., >1.8 g/cc), high modulus (e.g., >150 GPa), and low stress (e.g., <−500 MPa). Particularly, an in-situ deposition-implantation process is disclosed to form a high density carbon film with increased hardness and reduced stress in a deposition chamber. The in-situ deposition-implantation process can be performed in a cyclic or simultaneous fashion to allow the carbon film to form with any target thickness without being limited to ion penetration threshold, which would otherwise have been encountered if the deposition and implantation processes were performed ex-situ. The carbon films fabricated according to the embodiments described herein are amorphous in nature and have a higher etch selectivity with much greater modulus (e.g., >150 GPa) along with lower stress (<−500 MPa) than conventional patterning films. The carbon films fabricated according to the embodiments described herein not only have a low stress but also have a high $sp^3$ carbon content (e.g., diamond-like films). In general, the deposition process described herein is also fully compatible with current integration schemes for hardmask applications.

While high density carbon films are discussed in this disclosure, it is contemplated that various embodiments of this disclosure can also be used to improve film stress, density, or Young's modulus of any films. In addition, it is contemplated that aspects of the present disclosure are applicable to any deposition processes or patterning schemes, such as a self-aligned triple patterning (SATP) process, a self-aligned quadruple patterning (SAQP) process, a via/hole shrink process, a back end of line (BEOL), etc., that utilize a hardmask or protective sacrificial layer, as employed in various semiconductor processes such as NAND flash application, DRAM application, or CMOS application, etc.

Embodiments described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used.

Figure 1A:
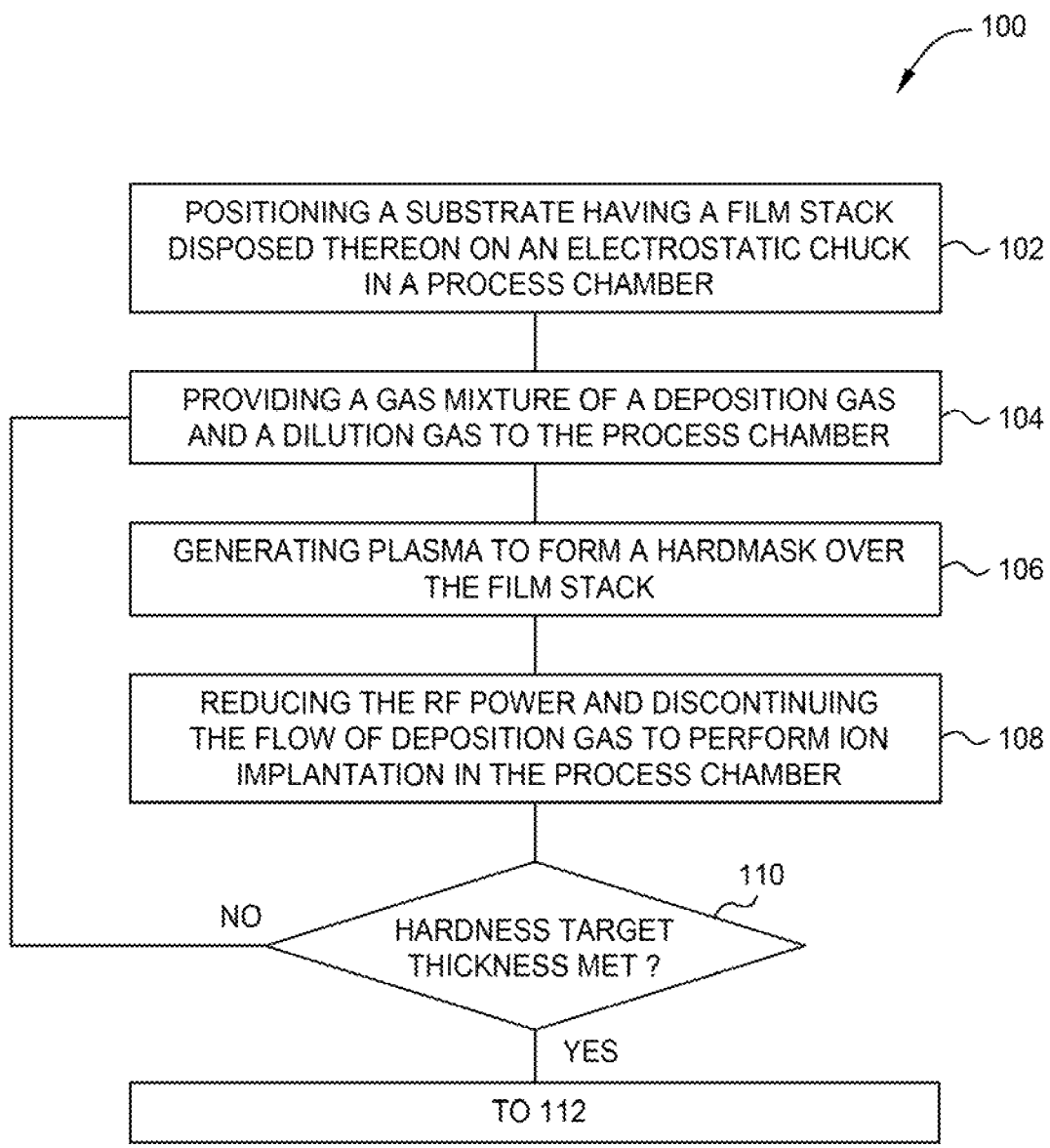
FIGS. 1A and 1B are flow diagrams setting forth a method for forming a hardmask on a film stack in accordance with embodiments of the present disclosure.
Figure 1B:
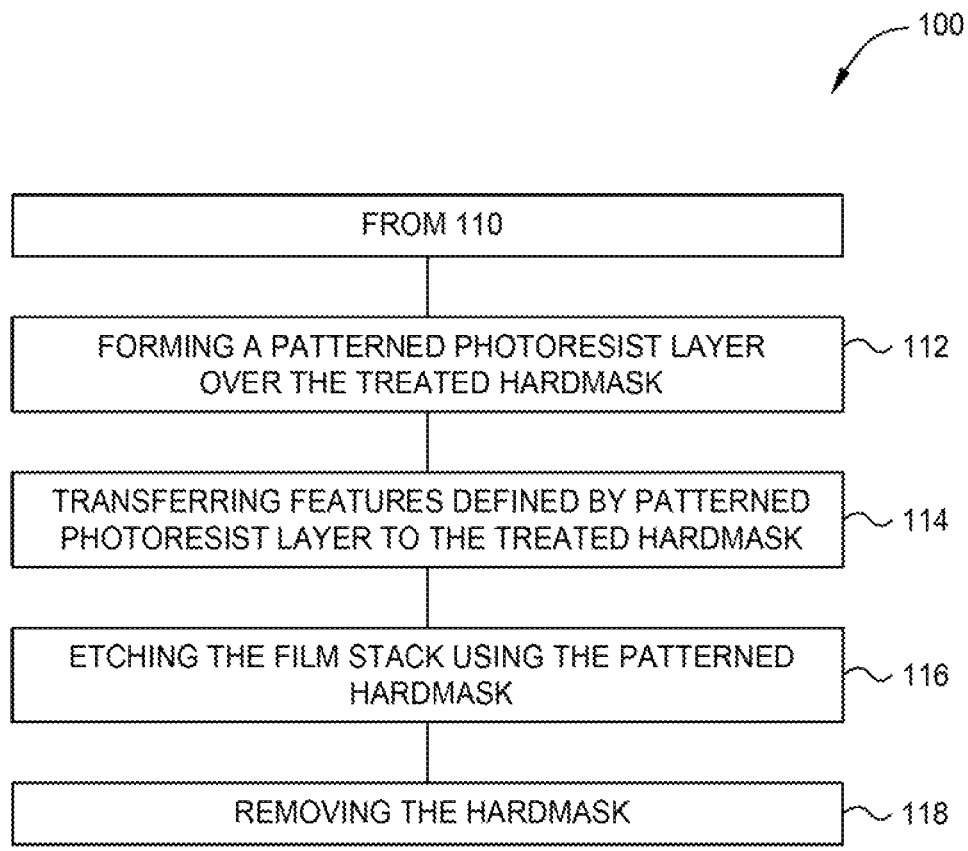

FIGS. 1A and 1B are flow diagrams setting forth a method 100 for forming a hardmask on a film stack disposed on a substrate in accordance with embodiments of the present disclosure. FIGS. 2A-2F are schematic, cross-sectional views of a stack 200 illustrating a hardmask formation sequence according to the method 100. The hardmask may be a diamond-like carbon layer described above, and can be utilized to manufacture stair-like structures in the film stack for three dimensional semiconductor devices, or any suitable device manufacturing applications. It should also be understood that the operations depicted in FIGS. 1A and 1B may be performed simultaneously and/or in a different order than the order depicted in FIGS. 1A and 1B.

Figure 2A:
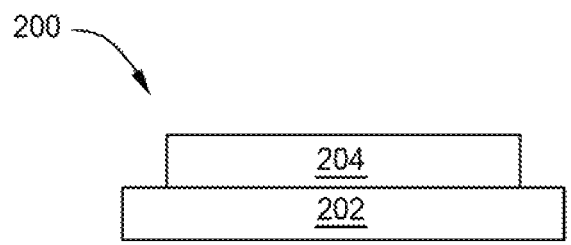
FIGS. 2A-2F are schematic, cross-sectional views of a stack illustrating a hardmask formation sequence according to the method of FIGS. 1A and 1B.

The method 100 begins at operation 102 by positioning a stack, such as a stack 200 depicted in FIG. 2A, into a process chamber, such as a PECVD chamber. The stack 200 may be positioned on an electrostatic chuck disposed in the PECVD chamber. However, any suitable substrate support may be used to replace the electrostatic chuck. Once the stack 200 is positioned on the electrostatic chuck, a chucking voltage (either constant or pulsed) is applied to the electrostatic chuck to clamp the substrate 202 to the electrostatic chuck. The stack 200 includes a substrate 202 and one or more layers disposed thereon. In an example as shown, the substrate 202 has a film stack 204 disposed thereon. The substrate 202 may be a silicon-based material or any suitable insulating material or conductive material as needed. For example, the substrate 202 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 202 may have various dimensions, such as 200 mm, 300 mm, and 450 mm or other diameter, as well as, rectangular or square panel shapes. Unless otherwise noted, embodiments and examples described herein are conducted on substrates with a 200 mm diameter, a 300 mm diameter, or a 450 mm diameter. In the embodiment wherein a SOI structure is utilized for the substrate 202, the substrate may include a buried dielectric layer disposed on a silicon crystalline substrate. In the embodiment depicted herein, the substrate 202 may be a crystalline silicon substrate.

The film stack 204 may be a single layer or a number of vertically stacked layers. For example, the film stack 204 may include pairs of a first layer (not shown) and a second layer (not shown) repeatedly formed in the film stack 204. The pairs include alternating first layers and second layers repeatedly formed until desired numbers of pairs of the first layers and the second layers are reached. The film stack 204 may be a part of a semiconductor chip, such as a three-dimensional memory chip. In one embodiment, the film stack 204 is utilized to form multiple gate structures for a three-dimensional memory chip. In such a case, the first layers formed in the film stack 204 may be a first dielectric layer and the second layers formed in the film stack 204 may be a second dielectric layer. Suitable dielectric layers for the first layers and the second layer may include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some embodiments, one or both of the first and second dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. The film stack 204 may have a total thickness between about 100 Å and about 2000 Å. In one embodiment, a total thickness of the film stack 204 is about 3 microns to about 10 microns and will vary as technology advances.

During operation 102, several process parameters may be regulated. In one embodiment suitable for processing a 300 mm substrate, the process pressure in the processing volume may be maintained at about 0.1 mTorr to about 10 Torr (e.g., about 2 mTorr to about 50 mTorr; or about 5 mTorr to about 20 mTorr). The processing temperature and/or substrate temperature may be maintained at about −50 degrees Celsius to about 350 degrees Celsius (e.g., about 0 degrees Celsius to about 50 degrees Celsius; or about 10 degrees Celsius to about 20 degrees Celsius).

At operation 104, a hydrocarbon-containing gas is flowed into the process chamber. The hydrocarbon-containing gas may be flowed into the process chamber either through a gas distribution assembly (disposed on the top of the process chamber above the electrostatic chuck) or via a sidewall of the process chamber. The hydrocarbon-containing gas may include at least one hydrocarbon compound. The hydrocarbon compound can be any liquid or gas. In one embodiment, the hydrocarbon compound is a gaseous hydrocarbon. In another embodiment, the hydrocarbon compound may initially be a liquid, and may be delivered to the processing volume via a vaporizer or bubbler, or other liquid precursor delivery system.

In one embodiment, the hydrocarbon compound has a general formula $C_xH_y$, where x has a range of between 1 and 20 and y has a range of between 1 and 20. Suitable hydrocarbon compounds may include, for example, acetylene ($C_2H_2$), ethylene ($C_2H_4$), ethane ($C_2H_6$), propyne ($C_3H_4$), propylene ($C_3H_6$), propane ($C_3H_8$), butane ($C_4H_{10}$), methane ($CH_4$), butylene ($C_4H_8$), butane ($C_4H_{10}$), pentane ($C_5H_{12}$), hexane ($C_6H_{14}$), adamantine ($C_{10}H_{16}$), norbornene ($C_7H_{10}$), or combinations thereof. $C_2H_2$ may be advantageous due to formation of more stable intermediate species, which allows more surface mobility.

In one embodiment, the hydrocarbon compound is an aromatic hydrocarbon compound, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or combinations thereof. In some cases, hydrocarbon compounds containing oxygen and halogenated precursors are not required.

In some embodiments, an inert gas, such as argon (Ar) and/or helium (He) may be supplied with the hydrocarbon-containing gas into the process chamber. Other inert gases, such as nitrogen ($N_2$) and nitric oxide (NO), may also be used to control the density and deposition rate of the diamond-like carbon layer.

In some embodiments, the hydrocarbon-containing gas may further include one or more dilution gases. Suitable dilution gases may include, but are not limited to, helium (He), argon (Ar), xenon (Xe), hydrogen ($H_2$), nitrogen ($N_2$), ammonia ($NH_3$), nitric oxide (NO), or combinations thereof. Ar, He, and $N_2$ may be used to control the density and deposition rate of the diamond-like carbon layer. In some cases, the addition of $N_2$ and/or $NH_3$ can be used to control the hydrogen ratio (e.g., carbon to hydrogen ratio) of the diamond-like carbon layer.

Figure 2B:
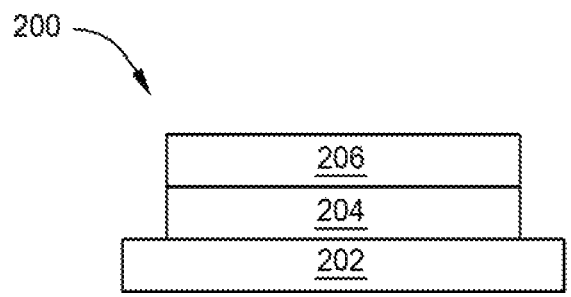

At operation 106, a plasma is generated in the process chamber from the gas mixture to form a hardmask 206 on the film stack 204, as shown in FIG. 2B. The plasma may be generated by applying a first RF power (bias or source) to the electrostatic chuck. The first RF power may be from about 1 Kilowatts to about 10 Kilowatts at a frequency of about 0.4 MHz to about 300 MHz, for example about 11 MHz to about 60 MHz. In one embodiment, the first RF power is provided at about 2 Kilowatts and a frequency of about 13.56 MHz. The first RF power may be provided from an RF power generator to the electrostatic chuck via a first electrode disposed in the electrostatic chuck. In some cases, the first electrode may also be in electronic communication with a chucking power source, which provides direct current (DC) power to electrostatically secure the substrate 202 to the upper surface of the electrostatic chuck.

Additionally or alternatively, the first RF power may be applied to an upper electrode, such as a showerhead that is disposed at the top of the process chamber opposing the electrostatic chuck. In some embodiments, the first RF power may be applied to at least one of the upper electrode, the bottom electrode (e.g., the first electrode), and an ICP coil which surrounds a portion of the process chamber. The ICP coil may be used to form the plasma or to tune the uniformity of the plasma within the process chamber. The top electrode, the bottom electrode, and the ICP coil can be powered simultaneously, or two of the three can be powered simultaneously, depending on the power scheme. The applied RF frequency can range from a few hundreds of kHz to tens of MHz. Multiple frequencies could also be applied to the top electrode or bottom electrode to optimize ion fluxes and energy incident onto the substrate In one embodiment, the hardmask 206 is a diamond-like carbon film as discussed above. The hardmask 206 may be deposited by a blanket deposition process over the film stack 204. It is noted that the hardmask 206 may be formed on any surfaces or any portion of the substrate 202 with or without the film stack 204 present on the substrate 202. In some embodiments, the process conditions established during operation 102 are maintained during operations 104 and 106. In one embodiment, the pressure of the process chamber during formation of the hardmask 206 is maintained at about 2 mTorr to about 20 mTorr.

Figure 2C:
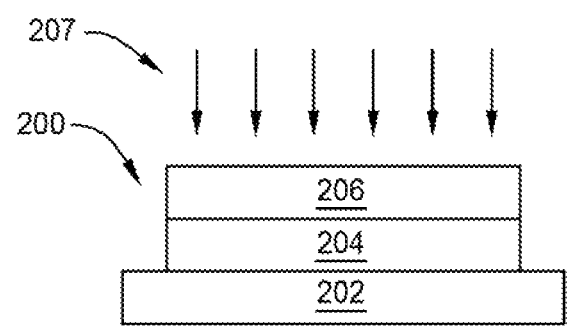

At operation 108, an ion implantation process is performed in the process chamber to treat the hardmask 206, as shown in FIG. 2C. In one embodiment, the ion implantation process is performed in-situ in the same process chamber where the deposition process of the hardmask 206 (i.e., operation 106) was performed. During operation 108, the flow of the hydrocarbon-containing gas is discontinued while the inert gas and/or the dilution gas supplied during operation 104 may be maintained. Meanwhile, the first RF power applied to the electrostatic chuck during operation 106 is reduced to a minimum level that is sufficient to sustain the plasma (i.e., the plasma is continuous during operation 106 and 108). For example, the first RF power may be reduced from about 2 Kilowatts to about 200 Watts.

The ion implantation process is performed by implanting ions, such as ions from the continuous flow of the inert gas, and ions from the hydrocarbon-containing gas that is still remaining in the plasma). In some embodiments, the ions are implanted into the hardmask 206 using a direct current (DC) bias voltage. The DC bias voltage is overlaid on top of the reduced first RF power. Particularly, the DC bias voltage drives high mono-energetic ions into the hardmask 206. The DC bias voltage may be provided to the electrostatic chuck via a second electrode. The second electrode may be disposed in the electrostatic chuck and in electrical communication with a DC power source that provides the bias voltage to the second electrode. Alternatively, the DC bias voltage may be provided to the first electrode from the chucking power source. In any case, the DC bias voltage may be between about 2 Kilovolts and about 15 Kilovolts. In one embodiment, the DC bias voltage is between about 5 Kilovolts and about 12 Kilovolts, for example about 8 Kilovolts. Since the DC bias voltage is high, the DC bias voltage can be pulsed during the ion implantation process. In various embodiments, the pulse width of the DC bias voltage may be of the order of about 1 microsecond to about 1 millisecond. In some embodiments, the DC bias voltage is applied at a pulse frequency of 10 Hz to about 10 kHz with a pulse width of about 5 microseconds to about 30 milliseconds.

In some embodiments, the ions are implanted into the hardmask 206 using a second RF power (bias or source). Likewise, the second RF power is overlaid on top of the reduced first RF power. The second RF power may be provided from an RF power generator to the electrostatic chuck via a third electrode disposed in the electrostatic chuck. The second RF power may be from about 1 Kilowatts to about 10 Kilowatts at a frequency of about 0.4 MHz to about 300 MHz, for example about 11 MHz to about 60 MHz. In one embodiment, the first RF power is provided at about 2 Kilowatts and a frequency of about 13.56 MHz. The second RF power can be pulsed during the ion implantation process. For example, the second RF power can be pulsed with a duty cycle in a range from about 10% to about 80% with a frequency of about 1 Hz to about 50 kHz.

In cases where the second RF power is used and the depositing species also acts as the implanting species (e.g., $H_2$ from the hydrocarbon-containing gas), the reduced first RF power and the second RF power may be offset temporally so that the reduced first RF power and the pulsed second RF power is synchronous or non-synchronous, thereby separating the deposition phase and treatment phase (i.e., ion implantation). For example, when the second RF power and the reduced first RF power are both on, ions are accelerated causing bombardment of the hardmask 206 to occur, and the deposition of the hardmask 206 may be minimized because a majority of the film growth comes from the primary plasma (e.g., first RF power) that is being operated at the low level (e.g., 200 Watts). Therefore, the ion implantation dominates. When the second RF power is pulsed and the reduced first RF power is on, the deposition of the hardmask 206 is increased and becomes the dominating process. Therefore, the film deposition dominates.

Regardless of whether the ion implantation process uses the DC bias voltage or the second RF power, little or no deposition of hardmask 206 will occur because the flow of the deposition gas (i.e., hydrocarbon-containing gas) is turned off. Therefore, the pulsing of the DC bias voltage or the pulsed second RF power separates the deposition phase and the treatment phase (i.e., ion implantation process), making the formation and treatment of the hardmask 206 a cyclic deposit-treat process. During the ion implantation process, the ions from the continuous flow of the inert gas, such as argon or helium ions, and ions from the hydrocarbon-containing gas remaining in the plasma, are attracted or driven by the DC bias voltage or the second RF power and moved forward to the hardmask 206. The DC bias voltage or the second RF power serves to treat the hardmask 206 by bombarding the surface of the hardmask 206 with the ions. As a result, the stress in the deposited hardmask 206 is reduced.

The ion implantation process may be performed until the implanted ions reach a penetration threshold, which is due to implanted ions gradually losing energy as implanted ions travel through the hardmask 206. The penetration threshold may be determined by the depth of penetration of ions. Alternatively, the ion implantation process may be performed until a predetermined implantation depth is reached. The predetermined implantation depth or the ion penetration threshold may be in a range between 10 nanometers and 1 micrometer, which may vary depending on the type and size of the ions and the bias voltage utilized to energize the ions 207.

The implant energy may be between about 0.5 keV and about 60 keV, for example about 6 keV to about 45 keV, depending on the depth of implantation desired. The ion dosage may be in a range from about $1\times10^{13}$ $cm^{-2}$ to about $1\times10^{17}$ $cm^{-2}$, for example about $5\times10^{16}$ $cm^{-2}$. The extremely low pressure (e.g., 2 mTorr to about 20 mTorr) enables very high energetic ions to treat/implant the surface of the hardmask 206. Without being bound by any particular theory, it is believed that the implanted ions can abstract residual hydrogen atoms from the dangling carbon-hydrogen bonds of the hardmask 206 and form a carbide structure within the hardmask 206. The carbide structure exhibits increased hardness when compared to un-treated hardmask. It is also believed that the implanted ions occupy interstitial voids present within the hardmask 206, which can result in an increased density of the hardmask 206. The increased density further increases the mechanical integrity of the hardmask 206. The increased hardness and density of the hardmask 206 can provide a mechanically robust hardmask 206, which in turn leads to improved etch selectivity and reduced internal stress. As a result, undesirable substrate deformation is eliminated.

The in-situ deposition-implantation process is beneficial because the implantation process occurs in the same process chamber where the hardmask deposition was occurred. Therefore, the hardmask 206 can be deposited and treated without having to break the vacuum and transfer to an ex-situ implantation tool. As a result, the overall throughput is improved and the cost associated with ex-situ implantation tools is reduced. In addition, since the implanted ions have a penetration threshold, the thickness of the hardmask that are treatable ex-situ is limited. With the in-situ deposition/ion implantation process, the deposition and treatment of the hardmask can be performed in a cyclic fashion to tailor the hardmask to potentially any target thickness in the same process chamber.

At operation 110, a decision is made as to determine whether the deposited hardmask 206 that has been treated reaches a target thickness. The hardmask 206 may have a target thickness corresponding to the subsequent etching requirements of the film stack 204. In one example, the target thickness of the hardmask 206 is between about 0.5 µm and about 1.5 µm, such as about 1.0 µm. If the target thickness of the hardmask 206 has not been reached, another cycle of deposition/ion implantation process (e.g., operations 104, 106 and 108) may be performed before the thickness of the treated hardmask 206 is again compared to the target thickness. In some embodiments where the implanted ions reach predetermined implantation or penetration depth but the hardmask 206 has not yet reached the desired thickness, another cycle of deposition/ion implantation process (e.g., operations 104, 106 and 108) can be performed before the thickness of the treated hardmask 206 is again compared to the target thickness. The cyclic process of in-situ hardmask deposition and ion implantation is repeated until the deposited hardmask 206 reaches the target thickness.

Figure 2D:
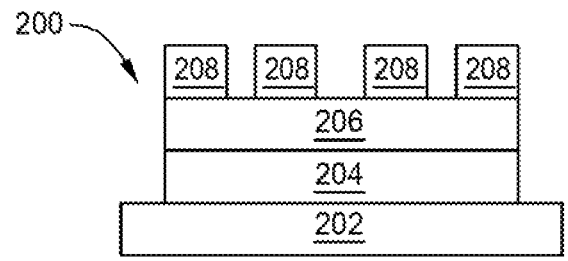

At operation 112, once the hardmask 206 reaches the target thickness, a patterned photoresist layer 208 is formed over the treated hardmask 206, as shown in FIG. 2D. Features or patterns may be transferred to the photoresist 208 from a photomask utilizing an energy source, such as light energy. In one embodiment, the photoresist is a polymeric material and the patterning process is performed by a 193 nm immersion photolithography process, or other similar photolithography process. Similarly, lasers may also be utilized to perform the patterning process.

Figure 2E:
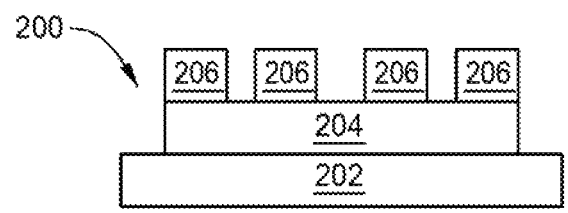

At operation 114, the treated hardmask 206 is patterned by, for example, a photolithography and one or more etch processes, to transfer the features from the photoresist 208 to the hardmask 206, as shown in FIG. 2E. The etching process may be performed in any suitable etch chamber, such as a plasma etch chamber. Thereafter, the photoresist layer 208 is removed by any suitable process, such as an ashing process or a wet etch process.

Figure 2F:
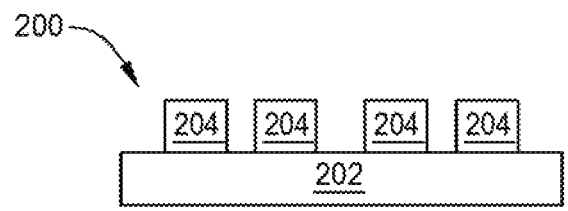

At operation 116, the film stack 204 is etched using the patterned hardmask 206, as shown in FIG. 2F. The etching of the film stack 204 may be performed in any suitable process chamber, such as a plasma etch chamber. Etchants, such as fluorocarbons, may be used to remove the exposed portions of the film stack 204. The active species of the etchants are selective so that they are substantially unreactive with the implanted ions of the hardmask 206. Thus, the etchants are selective for the film stack 204. Suitable examples of etchants may include, but are not limited to, $CF_4$, $CHF_3$, HBr, $BCl_3$, or $Cl_2$. The etchants may be provided to with an inert carrier gas. The hardmask 206 is then removed using any suitable hardmask removal process. For example, an oxygen plasma may be utilized to remove the hardmask 206. The resulting stack 200 includes the film stack 204 having a feature, such as a high aspect ratio feature, formed therein. The resulting stack 200 may then be subjected to further processing to form a functional semiconductor device.

Figure 3A:
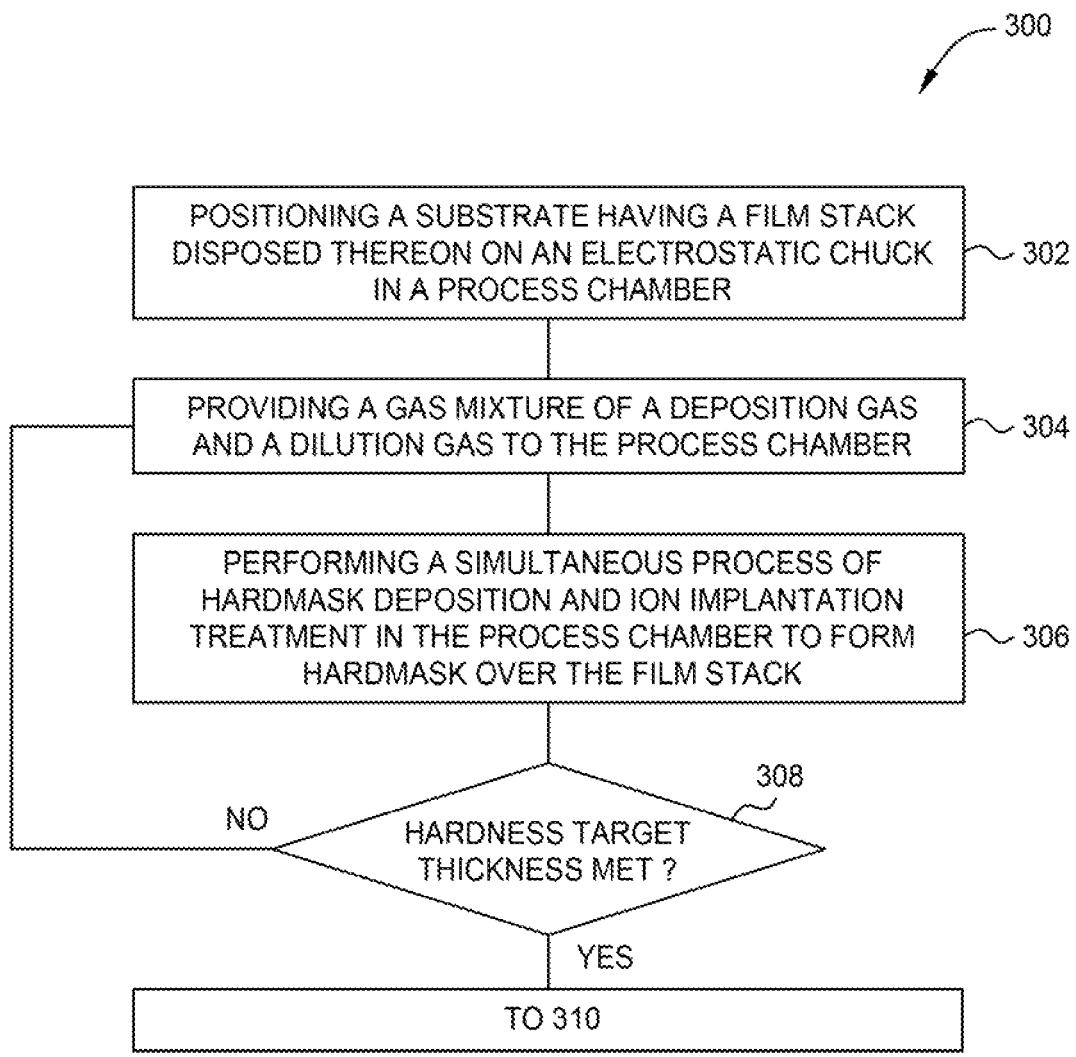
FIGS. 3A and 3B are flow diagrams setting forth a method for depositing a hardmask on a film stack in accordance with embodiments of the present disclosure.
Figure 3B:
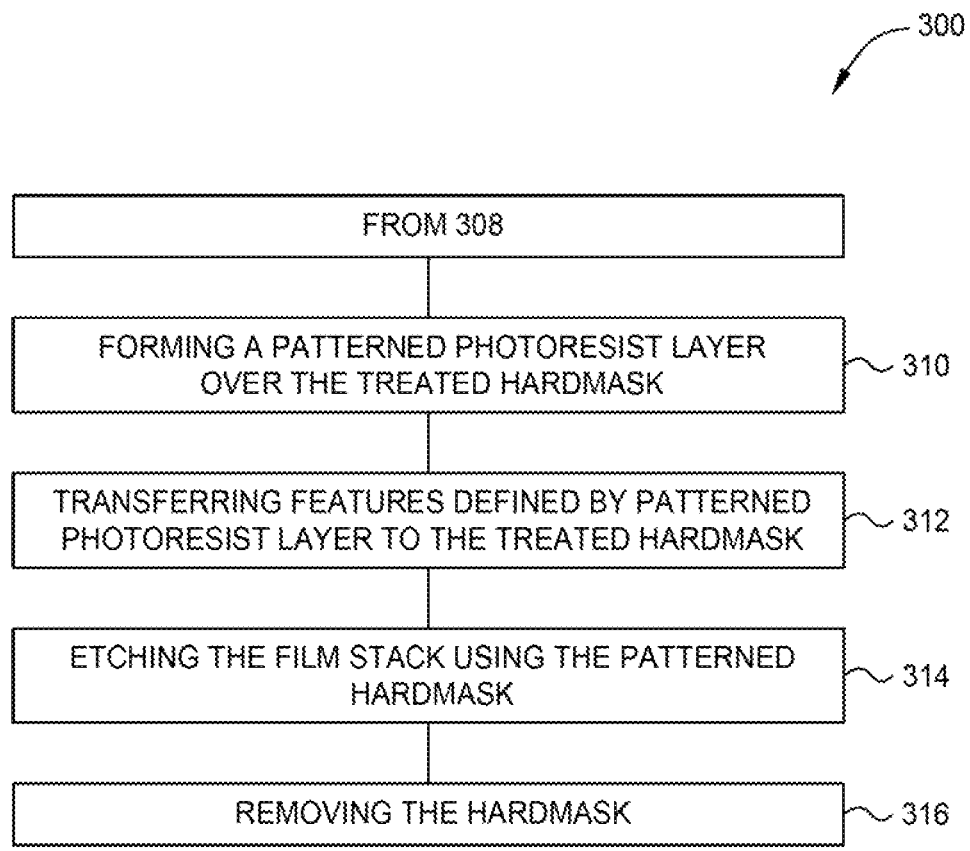

FIGS. 3A and 3B illustrate a flow diagram of a method 300 for depositing a hardmask on a film stack disposed on a substrate in accordance with embodiments of the present disclosure. The method 300 can be used to process the stack 200 as shown in FIGS. 2A-2F. Therefore, the method 300 will be described with respect to FIGS. 2A-2F. Likewise, the deposited hardmask may be a diamond-like carbon layer as described above, and can be utilized to manufacture stair-like structures in the film stack for three dimensional semiconductor devices, or any suitable device manufacturing applications. It should also be understood that the operations depicted in FIGS. 3A and 3B may be performed simultaneously and/or in a different order than the order depicted in FIGS. 3A and 3B.

Operations 302 and 304 of the method 300 are similar to operations 102 and 104, and thus will not be described for the sake of brevity. As such, the stack 200 is formed with a film stack 204 deposited over a substrate 202, as shown in FIG. 2A. At operation 306, a simultaneous process of a hardmask deposition and ion implantation treatment is performed in the process chamber to form a hardmask 206 on the film stack 204, as shown in FIG. 2B. The simultaneous process may be performed by generating a plasma in the process chamber from the gas mixture (e.g., a hydrocarbon-containing gas and inert gas/dilution gas) to form a layer of the hardmask 206 over the film stack 204. The plasma may be generated at the substrate level by applying a high voltage RF bias to the electrostatic chuck. The high voltage RF bias may be in a range from about 1 Kilowatts to about 15 Kilowatts at a frequency of about 0.4 MHz to about 300 MHz, for example about 11 MHz to about 60 MHz. In one embodiment, the high voltage RF bias is provided at about 8 Kilowatts and a frequency of about 13.56 MHz. The high voltage RF bias may be provided from an RF power generator to the electrostatic chuck via a third electrode disposed in the electrostatic chuck.

While depositing the hardmask 206 over the film stack 204, the high voltage RF bias applied to the electrostatic chuck can also serve as an implant energy to attract ions from the gas mixture (i.e., hydrocarbon-containing gas, inert gas/dilution gas) moving towards the growing hardmask 206. Therefore, an ion implantation treatment of the hardmask 206 is performed concurrently with the hardmask deposition, as shown in FIG. 2C. Ions are attracted and accelerated by the high voltage RF bias to bombard the surface of the hardmask 206, thereby reducing the stress of the hardmask 206.

In some embodiments, a DC bias voltage may be additionally applied to the electrostatic chuck to facilitate the ion implantation treatment. Ions from the gas mixture (i.e., hydrocarbon-containing gas, inert gas/dilution gas) can be attracted and accelerated by the DC bias voltage to bombard the surface of the hardmask 206, thereby reducing the stress of the hardmask 206. The DC bias voltage can be provided to the electrostatic chuck via the second electrode, which may be disposed in the electrostatic chuck and in electrical communication with a DC power source, as discussed above with respect to FIGS. 1A and 1B. Alternatively, the DC bias voltage may be provided to the first electrode from the chucking power source. The bias voltage may be between about 1 Kilovolts to about 15 Kilovolts. In one embodiment, the DC bias voltage is between about 2 Kilovolts and about 6 Kilovolts. In another embodiment, the bias voltage is between about 8 Kilovolts and about 10 Kilovolts. Similar to operation 108, the implant energy may be between about 0.5 keV and about 60 keV, for example about 6 keV to about 45 keV, depending on the depth of implantation desired. The ion dosage may be in a range from about $1\times10^{13}$ $cm^{-2}$ to about $1\times10^{17}$ $cm^{-2}$, for example about $5\times10^{16}$ $cm^{-2}$.

In any case, the flow of the gas mixture (e.g., hydrocarbon-containing gas and inert gas/dilution gas) is continuous throughout the operation 308. Therefore, the depositing species (e.g., ions or neutral species of carbon, hydrogen, etc.) used for hardmask deposition can also function as implanting species for ion implantation treatment. The in-situ process of the hardmask deposition and ion implantation treatment enables the hardmask 206 to be deposited and treated simultaneously and more efficiently as compared to embodiments where hardmask deposition and ion implantation process are separated by short duty-cycle RF or pulsed DC voltage.

At operation 308, a decision is made as to determine whether the deposited/treated hardmask 206 reaches a target thickness. The hardmask 206 may have a target thickness corresponding to the subsequent etching requirements of the film stack 204. In one example, the target thickness of the hardmask 206 is between about 0.5 μm and about 1.5 μm, such as about 1.0 μm. If the target thickness of the hardmask 206 has not been reached, another cycle of deposition/ion implantation process (e.g., operations 304 and 306) may be performed before the thickness of the treated hardmask 206 is again compared to the target thickness. The in-situ simultaneous process of the hardmask deposition and ion implantation treatment is repeated until the deposited/treated hardmask 206 reaches the target thickness.

Operations 310, 312, 314, and 316 are similar to operations 112, 114, 116, and 118, and thus will not be described for the sake of brevity.

Figure 4:
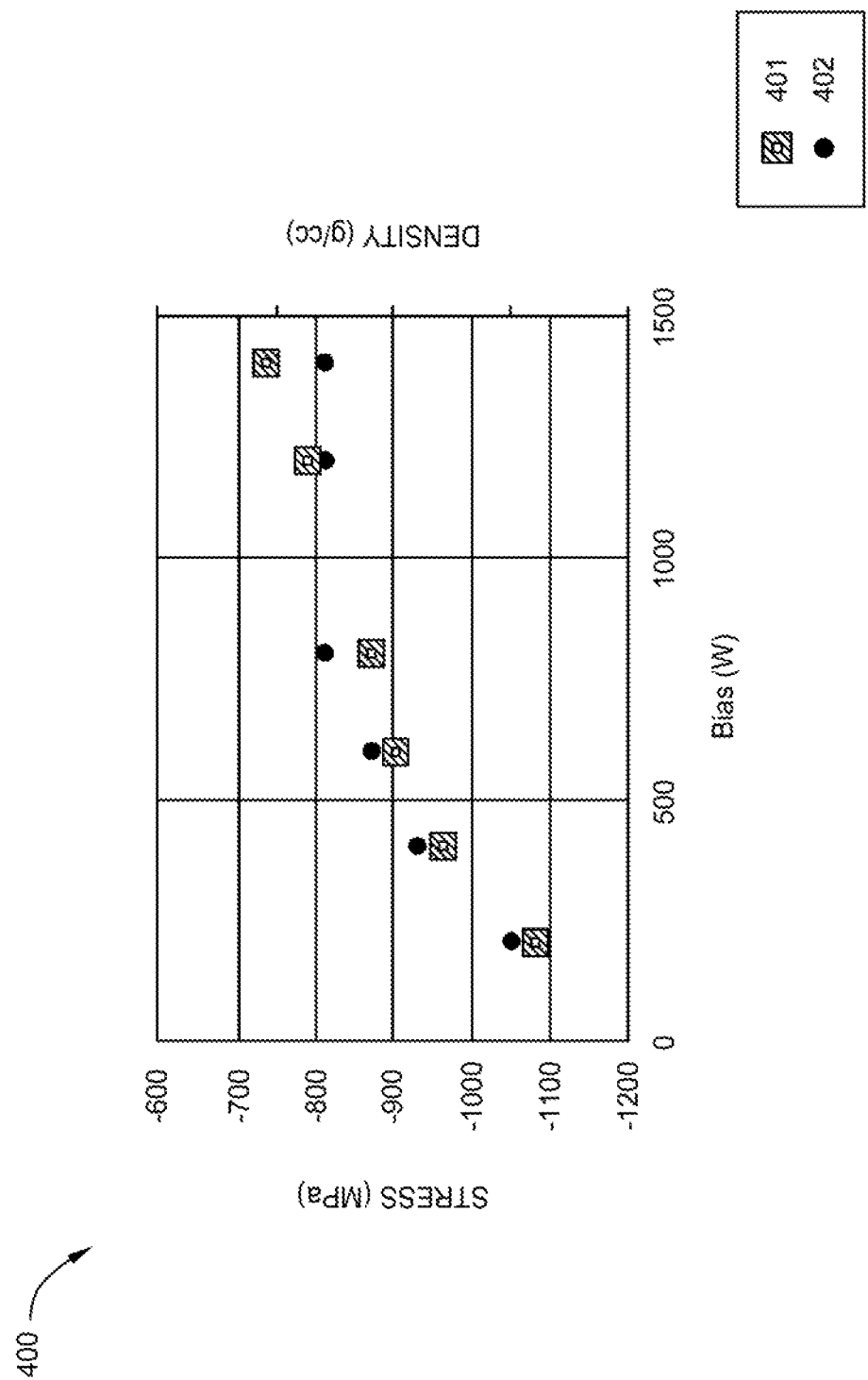
FIG. 4 is a graph depicting (1) stress as a function of bias power and (2) density as a function of bias power for a diamond-like carbon layer formed in accordance with one or more embodiments of the present disclosure.

FIG. 4 is a graph 400 depicting (1) stress as a function of bias power (represented by squares) and (2) density as a function of bias power (represented by dots), for a diamond-like carbon layer (e.g., hardmask) formed in accordance with one or more embodiments discussed above with respect to FIGS. 3A and 3B. The x-axis represents the bias power (Watts) and the y-axis represents the density (g/cc) of the deposited films. As illustrated in FIG. 4, for the most part, as bias power increases, the density of the as-deposited film increases. Particularly, the stress of the diamond-like carbon layer is lower at higher RF power/ion energy.

Figure 5:
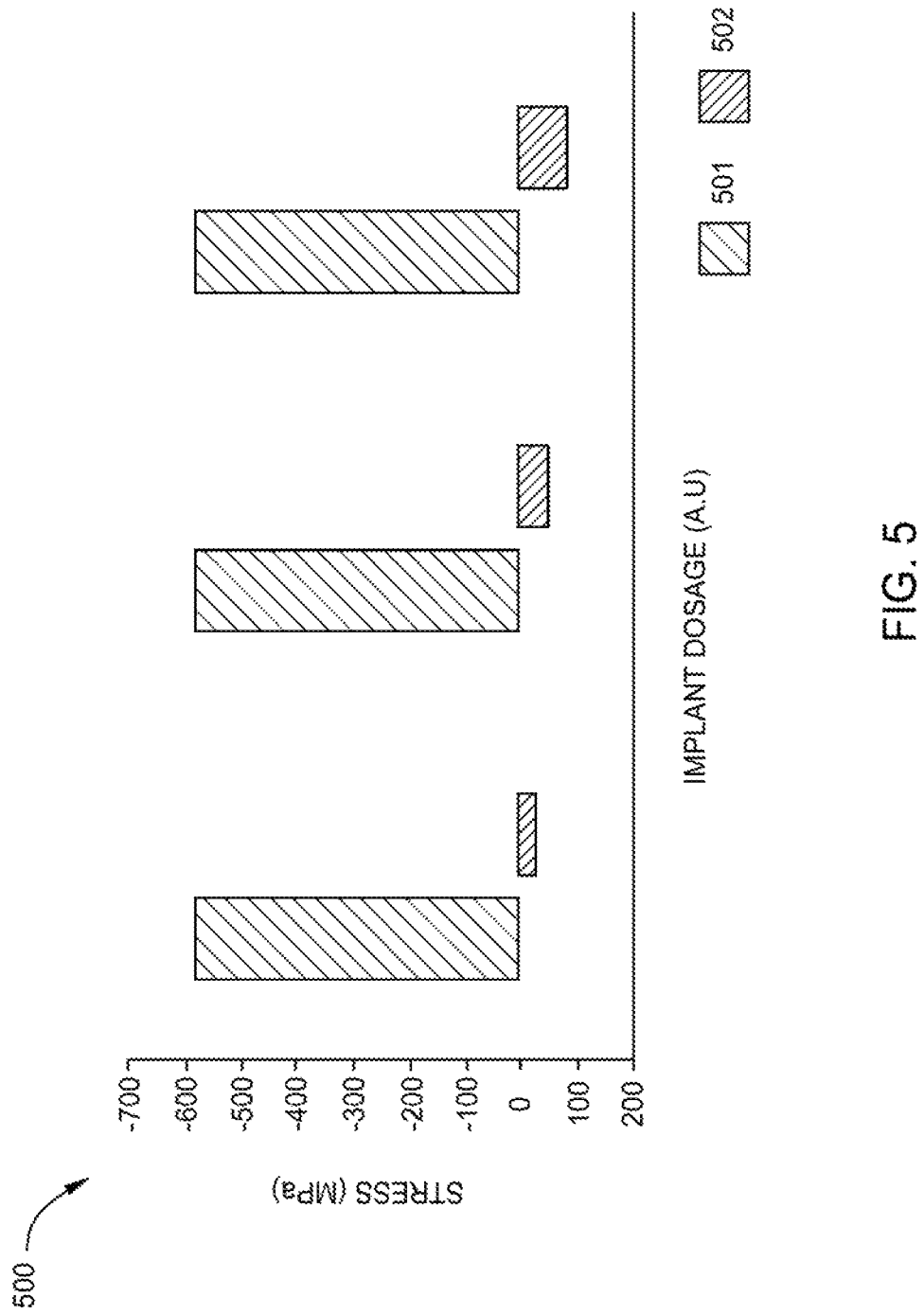
FIG. 5 is a graph depicting stress as a function of implant dosage for a diamond-like carbon layer formed in accordance with one or more embodiments of the present disclosure.

FIG. 5 is a graph 500 depicting stress as a function of implant dosage for a diamond-like carbon layer (e.g., hardmask) formed in accordance with one or more embodiments of the present disclosure. The graph 500 depicts stress data of as-deposited and post ion implantation of the diamond-like carbon films using an implant energy of about 35 keV. The x-axis represents the stress (MPa) of the deposited films and the y-axis represents the implant dosage (A.U). As illustrated in FIG. 5, the stress of the as-deposited film significantly decreases after ion implantation treatment.

Figure 6:
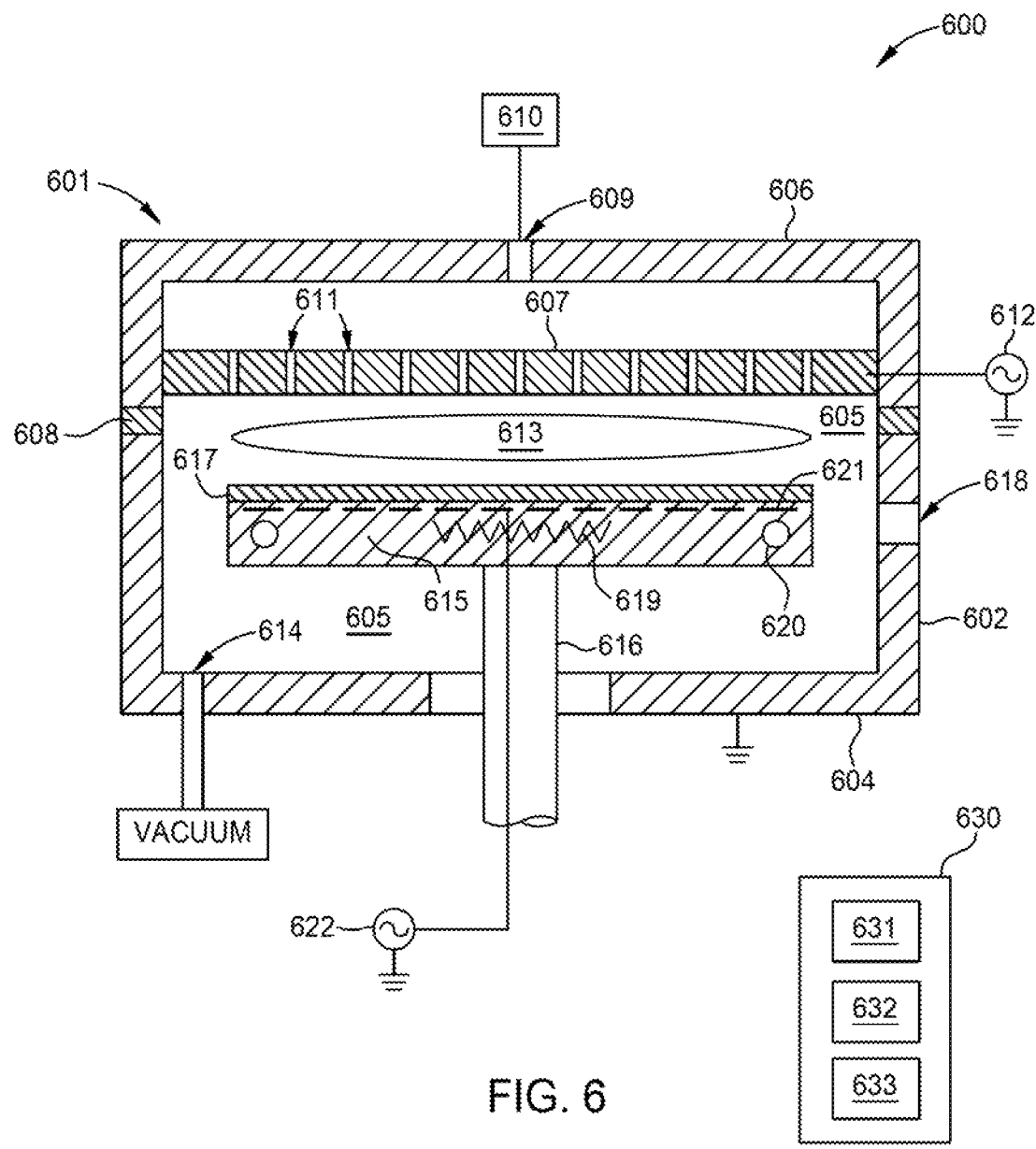
FIG. 6 is a schematic cross sectional view of an exemplary processing which may be used to practice the methods set forth herein.

FIG. 6 is a schematic cross sectional view of an exemplary processing which may be used to practice any one or combination of the methods set forth herein. The processing chamber 600 includes a chamber lid assembly 601, one or more sidewalls 602, and a chamber base 604. The chamber lid assembly 601 includes a chamber lid 606, a showerhead 607 disposed in the chamber lid 606, and an electrically insulating ring 608, disposed between the chamber lid 606 and the one or more sidewalls 602. The showerhead 607, one or more sidewalls 602, and the chamber base 604 together define a processing volume 605. A gas inlet 609, disposed through the chamber lid 606 is fluidly coupled to a gas source 610. The showerhead 607, having a plurality of openings 611 disposed therethrough, is used to uniformly distribute processing gases from the gas source 610 into the processing volume 605. The showerhead 607 is electrically coupled to a first power supply 612, such as an RF power supply, which supplies power to ignite and maintain a plasma 613 of the processing gas through capacitive coupling therewith. In other embodiments, the processing chamber 600 comprises an inductive plasma generator and the plasma is formed through inductively coupling an RF power to the processing gas.

The processing volume 605 is fluidly coupled to a vacuum source, such as to one or more dedicated vacuum pumps, through a vacuum outlet 614, which maintains the processing volume 605 at sub-atmospheric conditions and evacuates the processing gas and other gases therefrom. A substrate support 615, disposed in the processing volume 605, is disposed on a movable support shaft 616 sealingly extending through the chamber base 604, such as being surrounded by bellows (not shown) in the region below the chamber base 604. Herein, the processing chamber 600 is conventionally configured to facilitate transferring of a substrate 617 to and from the substrate support 615 through an opening 618 in one of the one or more sidewalls 602, which is conventionally sealed with a door or a valve (not shown) during substrate processing.

Herein, a substrate 617, disposed on the substrate support 615, is maintained at a desired processing temperature using one or both of a heater, such as a resistive heating element 619, and one or more cooling channels 620 disposed in the substrate support 615. Typically, the one or more cooling channels 620 are fluidly coupled to a coolant source (not shown), such as a modified water source having relatively high electrical resistance or a refrigerant source. In some embodiments, the substrate support 615 or one or more electrodes thereof 621 is electrically coupled to a second power supply 622, such as a continuous wave (CW) RF power supply or a pulsed RF power supply, which supplies a bias voltage thereto.

The processing chamber 600 further includes a system controller 630 which is used to control the operation of the processing chamber 600 and implement the methods set forth herein. The system controller 630 includes a programmable central processing unit, herein the central processing unit (CPU 631), that is operable with a memory 632 (e.g., non-volatile memory) and support circuits 633. The support circuits 633 are coupled to the CPU 631 and comprise cache, clock circuits, input/output subsystems, power supplies, and combinations thereof coupled to the various components of the processing chamber 600, to facilitate control thereof. The CPU 631 is one of any form of general purpose computer processor, such as a programmable logic controller (PLC), for controlling various components and sub-processors of the processing chamber 600. The memory 632, coupled to the CPU 631, is non-transitory and is typically one or more of readily available memories such as random access memory (RAM), read only memory (ROM), floppy disk drive, hard disk, or any other form of digital storage, local or remote.

Typically, the memory 632 is in the form of a computer-readable storage media containing instructions (e.g., non-volatile memory), that when executed by the CPU 631, facilitates the operation of the processing chamber 600. The instructions in the memory 632 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Thus, methods for forming a diamond-like carbon hardmask layer that may be utilized to form semiconductor devices are provided. By utilization of in-situ hardmask deposition-ion implantation process, the hardmask layer can be deposited and treated without having to break the vacuum and transfer to an ex-situ implantation tool. As a result, the overall throughput is improved and the cost associated with ex-situ implantation tools is reduced. In addition, the deposition and treatment of the hardmask can be performed in a cyclic or simultaneous fashion using either independent plasma sources or one high power (high voltage) plasma source to tailor the hardmask to potentially any target thickness in the same process chamber. Furthermore, the implanted ions function to increase the mechanical integrity and density of the hardmask while maintaining or reducing the internal stress of the hardmask. The increased mechanical integrity and density of the hardmask reduce line bending after the hardmask is etched and the maintained or reduced stress of the hardmask reduces or eliminates undesirable substrate bowing or deformation. In combination, the etch selectivity of the hardmask is increased.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate to form a carbon hardmask comprising at least two carbon hardmask layers, comprising:
   depositing a first carbon hardmask layer over a film stack formed on the substrate, wherein the substrate is positioned on an electrostatic chuck disposed in a process chamber;
   implanting ions into the carbon hardmask layer, wherein depositing the carbon hardmask layer and implanting ions into the carbon hardmask are performed in the same process chamber; and
   without the substrate leaving the process chamber, repeating depositing the one or more carbon hardmask layers and implanting ions into the carbon hardmask layer in a cyclic fashion until a pre-determined thickness of the carbon hardmask is reached.

2. The method of claim 1, wherein depositing the carbon hardmask is performed by applying a first RF power having a first power level to the electrostatic chuck via a first electrode disposed in the electrostatic chuck.

3. The method of claim 2, wherein the first RF power is in a range of about 1 Kilowatts to about 10 Kilowatts at a frequency of about 0.4 MHz to about 300 MHz.

4. The method of claim 2, wherein implanting ions into the carbon hardmask further comprising:
　after depositing the carbon hardmask over the film stack, discontinuing a flow of a hydrocarbon-containing gas for forming the carbon hardmask; and
　reducing the first RF power from the first power level to a second power level that is sufficient to sustain plasma in the process chamber.

5. The method of claim 1, wherein implanting ions into the carbon hardmask is performed by applying a DC bias voltage to the electrostatic chuck via a second electrode disposed in the electrostatic chuck.

6. The method of claim 5, wherein the DC bias voltage is in a range of about 2 Kilovolts to about 15 Kilovolts.

7. The method of claim 5, wherein the DC bias voltage is provided at a pulse frequency of 10 Hz to about 10 kHz with a pulse width of about 5 microseconds to about 30 milliseconds.

8. The method of claim 1, wherein implanting ions into the carbon hardmask is performed by applying a second RF power to the electrostatic chuck via a third electrode disposed in the electrostatic chuck.

9. The method of claim 8, wherein the second RF power is in a range of about 1 Kilowatts to about 10 Kilowatts at a frequency of about 0.4 MHz to about 300 MHz.

10. The method of claim 9, wherein the second RF power is pulsed with a duty cycle in a range from about 10% to about 80%.

11. A method of processing a substrate, comprising:
　depositing a carbon hardmask over a film stack formed on the substrate, wherein the substrate is positioned on an electrostatic chuck disposed in a process chamber;
　implanting ions into the carbon hardmask, wherein depositing the carbon hardmask and implanting ions into the carbon hardmask are performed in the same process chamber;
　repeating depositing the carbon hardmask and implanting ions into the carbon hardmask in a cyclic fashion until a pre-determined thickness of the carbon hardmask is reached; and
　after depositing the carbon hardmask over the film stack, discontinuing a flow of a hydrocarbon-containing gas for forming the carbon hardmask; and
　reducing the first RF power from the first power level to a second power level that is sufficient to sustain plasma in the process chamber.

12. The method of claim 11, wherein depositing the carbon hardmask is performed by applying a first RF power having a first power level to the electrostatic chuck via a first electrode disposed in the electrostatic chuck.

13. The method of claim 12, wherein the first RF power is in a range of about 1 Kilowatts to about 10 Kilowatts at a frequency of about 0.4 MHz to about 300 MHz.

14. The method of claim 11, wherein implanting ions into the carbon hardmask is performed by applying a DC bias voltage to the electrostatic chuck via a second electrode disposed in the electrostatic chuck.

15. The method of claim 14, wherein the DC bias voltage is in a range of about 2 Kilovolts to about 15 Kilovolts.

16. The method of claim 14, wherein the DC bias voltage is provided at a pulse frequency of 10 Hz to about 10 kHz with a pulse width of about 5 microseconds to about 30 milliseconds.

17. The method of claim 11, wherein implanting ions into the carbon hardmask is performed by applying a second RF power to the electrostatic chuck via a third electrode disposed in the electrostatic chuck.

18. The method of claim 17, wherein the second RF power is in a range of about 1 Kilowatts to about 10 Kilowatts at a frequency of about 0.4 MHz to about 300 MHz.

19. The method of claim 18, wherein the second RF power is pulsed with a duty cycle in a range from about 10% to about 80%.

* * * * *